(12) United States Patent
Usui

(10) Patent No.: US 7,733,995 B2
(45) Date of Patent: Jun. 8, 2010

(54) NOISE FILTER AND FILTERING METHOD

(75) Inventor: Minoru Usui, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 943 days.

(21) Appl. No.: 11/305,088

(22) Filed: Dec. 19, 2005

(65) Prior Publication Data
US 2007/0071085 A1 Mar. 29, 2007

(30) Foreign Application Priority Data
Sep. 29, 2005 (JP) ............................ 2005-285462

(51) Int. Cl.
*H04B 1/10* (2006.01)
(52) U.S. Cl. .................. 375/350; 375/229; 375/278; 375/284; 375/253; 375/254; 455/213; 370/290
(58) Field of Classification Search .............. 375/350, 375/229
See application file for complete search history.

(56) References Cited

U.S. PATENT DOCUMENTS

| | | | | |
|---|---|---|---|---|
| 3,593,162 A | * | 7/1971 | Patmore | 327/31 |
| 5,698,984 A | * | 12/1997 | Little et al. | 324/601 |
| 5,968,194 A | * | 10/1999 | Wu et al. | 714/726 |
| 7,174,502 B2 | * | 2/2007 | Miyamoto | 714/798 |
| 2004/0128579 A1 | * | 7/2004 | Khondker et al. | 713/500 |

FOREIGN PATENT DOCUMENTS

| | | |
|---|---|---|
| JP | 11-041298 | 2/1999 |
| JP | 2003-247453 | 9/2003 |

* cited by examiner

*Primary Examiner*—Shuwang Liu
*Assistant Examiner*—Lihong Yu
(74) *Attorney, Agent, or Firm*—Fujitsu Patent Center

(57) ABSTRACT

A noise filter, used for a digital signal, configuring an [N−1]-stage filter by connecting the N-number of flip flops in series comprises a selection unit for outputting a filter output signal by selecting one of signals filtered by one to (N−1) stages based on a selection signals; and a wave form check unit for making the selection unit change a selection thereby by changing a value of the selection signal based on a pulse width on the filter output signal which is output from the selection unit.

5 Claims, 5 Drawing Sheets

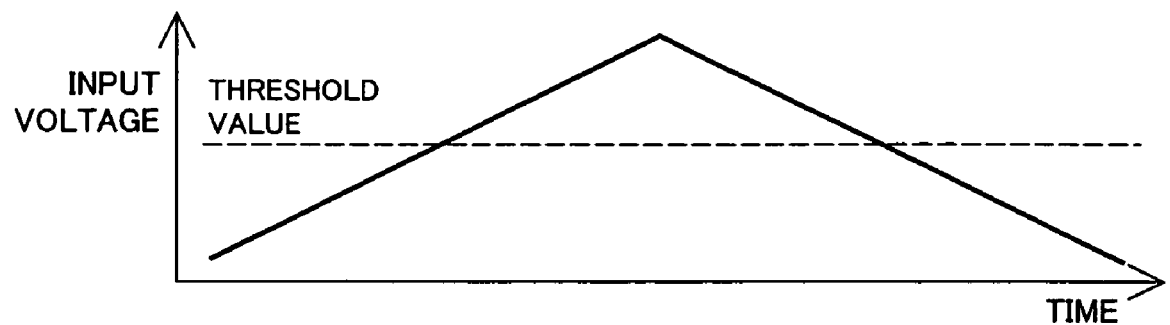
F I G. 1 A
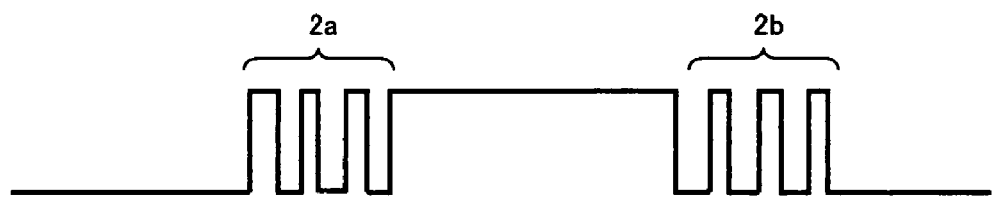
F I G. 1 B

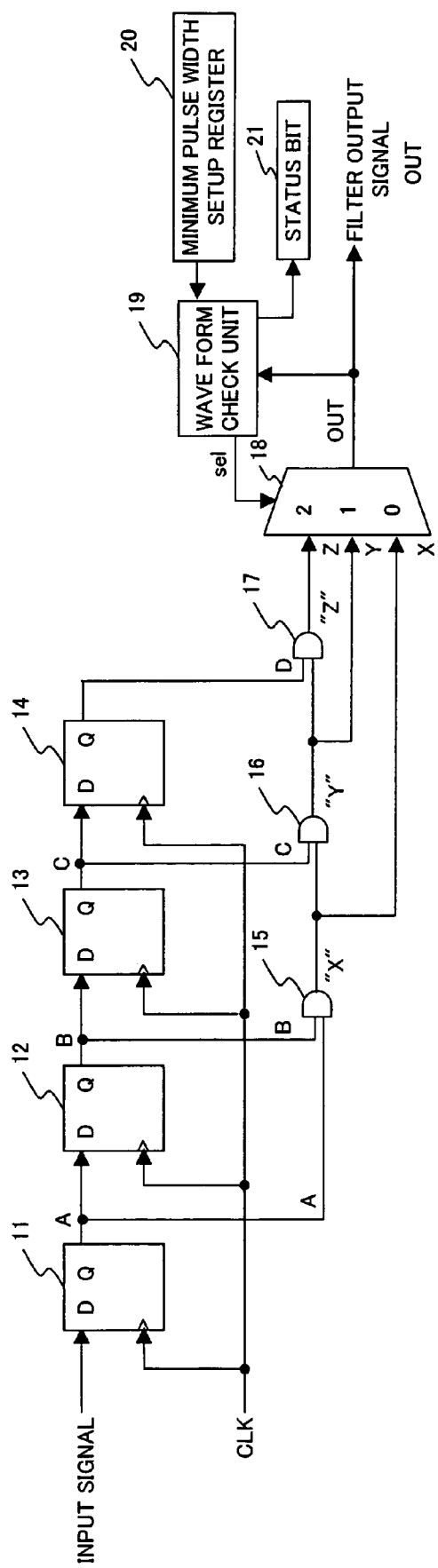
F I G. 2

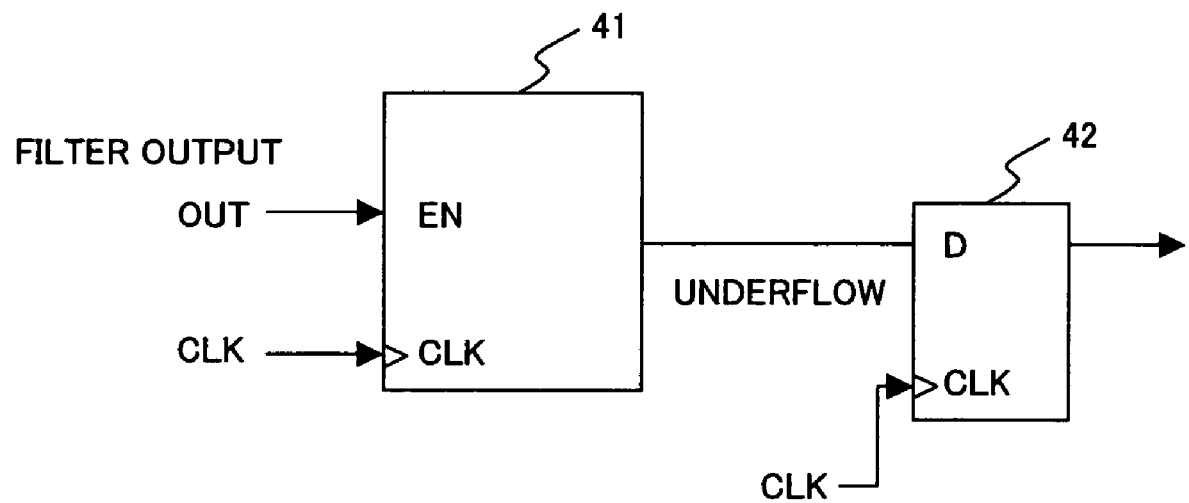
F I G. 4

NOISE FILTER AND FILTERING METHOD

CROSS-REFERENCE TO RELATED APPLICATIONS

This application is based upon and claiming the benefit of priority from the prior Japanese Patent Application No. 2005-285462, filed on Sep. 29, 2005, the entire contents of which are incorporated herein by reference.

BACKGROUND OF THE INVENTION

1. Field of the Invention

The present invention relates to a noise filter used for a digital signal.

2. Description of the Related Art

Currently used widely in various fields are microprocessors which receive an input signal through a filter as a digital signal input according to a specification, environment, et cetera.

For instance, a patent document 1 (a laid-open Japanese patent application publication No. 2003-247453) comprises a filter, which is constituted by a capacitor and a resistor, equipped in a digital input terminal of an on-vehicle controller for inputting a signal through the filter.

And a patent document 2 (a laid-open Japanese patent application publication No. 11-41298 has disclosed a configuration to equip a noise filter of a digital circuit in a telecommunication circuit for removing a noise on a pulse overlapped with serial data input thereto.

When processing an analog signal by a digital circuit, the analog signal is converted into a digital signal by an A/D (analog to digital) conversion.

In a circuit using a processor, a rise/fall transition time (Tr/Tf) of an analog signal input to a microprocessor is not allowed to become steep in order to reduce noise.

Because of this, the duration of an input signal staying in the neighborhood of an input threshold value of the processor becomes long, during which time the input signal transmitted to the processor repeats changes between low and high levels.

Therefore, if the above described signal is used as a GPIO (general purpose input/output) input signal or other input signal for detecting an edge, a malfunction may result.

FIG. 1 illustrates the point.

FIG. 1A shows an input analog signal, while FIG. 1B shows the result of an A/D conversion of the analog signal shown by FIG. 1A by an A/D converter.

As shown by FIG. 1B, if a gradually changing signal is A/D converted, a transistor repeats on/off transitions near the threshold value thereof constituting the A/D converter, resulting in noise 2a and 2b occurring in the neighborhood of rise/fall edges of an internal detection signal 1.

A countermeasure to the above described noise uses an analog or digital noise filter.

Generally a digital noise filter determines a unique time for a signal to pass through the filter.

An occurrence of noise, however, depends on environmental factors such as a temperature of a deployed processor, a state of a printed circuit board, an operating speed, etc., and therefore it is not possible to determine the noise removal time uniquely.

SUMMARY OF THE INVENTION

The challenge of the present invention is to provide a noise filter and filtering method capable of determining a noise removal time by hardware and determining a noise removal time most suitable to an environment in which a processor is used.

A noise filter according to the present invention, premising a noise filter, used for a digital signal, configuring an [N−1]-stage (i.e., N minus 1-stage) filter by connecting the N-number of flip flops in series, comprises a selection unit and a wave form check unit.

The selection unit outputs a filter output signal by selecting one of signals filtered by one to [N−1] stages of filters based on a selection signal.

The wave form check unit makes the selection unit change a selection thereby by changing a value of the selection signal based on a pulse width on the filter output signal which is output from the selection unit.

This configuration makes it possible to change the number of stages of filters dynamically by the pulse width of a filter output signal.

The noise filter may also further comprises a minimum pulse width designation register for setting a minimum width of a pulse of said filter output signal, wherein said wave form check unit makes said selection unit change a selection thereby by changing a value of said selection signal if a pulse signal of the filter output signal is not a pulse width with a pulse width equal to or greater than the pulse width which is specified by the minimum pulse width designation register.

This configuration makes it possible to set a value of a selection signal if the minimum pulse width of an input signal is known.

The noise filter may further comprise a filter value optimization complete flag for measuring a certain time, and which is set if optimizing said number of stages of filters is completed after the certain time elapses.

This configuration makes it possible to recognize an optimization of the number of stages of filters being completed.

The wave form check unit may also be configured to change the selection signal so that the selection unit changes a value of the selection signal to a signal filtered by a filter with a higher number of stages.

This configuration increases the number of stages of filters in order from a low number of stages, thereby enabling a setup of the optimal number of stages.

Meanwhile, the scope of the present invention includes not only a noise filter but also a filtering method for noise by a noise filter.

According to the present invention, it is possible to change over to a filter for a corresponding noise width by switching the number of stages of filters dynamically based on a noise width of an input signal.

Therefore, a filter is changed to the one with smallest number of stages, thereby making it possible to suppress a delay of time of an input signal propagating in an internal circuit caused by a noise filter.

And the number of stages of the filter is changed over dynamically by hardware, and can be accomplishable without the assistance of software.

BRIEF DESCRIPTION OF THE DRAWINGS

FIG. 1A shows an analog input signal that is input; and

FIG. 1B shows an A/D converted signal;

FIG. 2 exemplifies a comprisal of a noise filter circuit according to a preferred embodiment;

FIG. 4 shows a comprisal of a filter value optimization complete flag; and

DESCRIPTION OF THE PREFERRED EMBODIMENT

Figure 3:
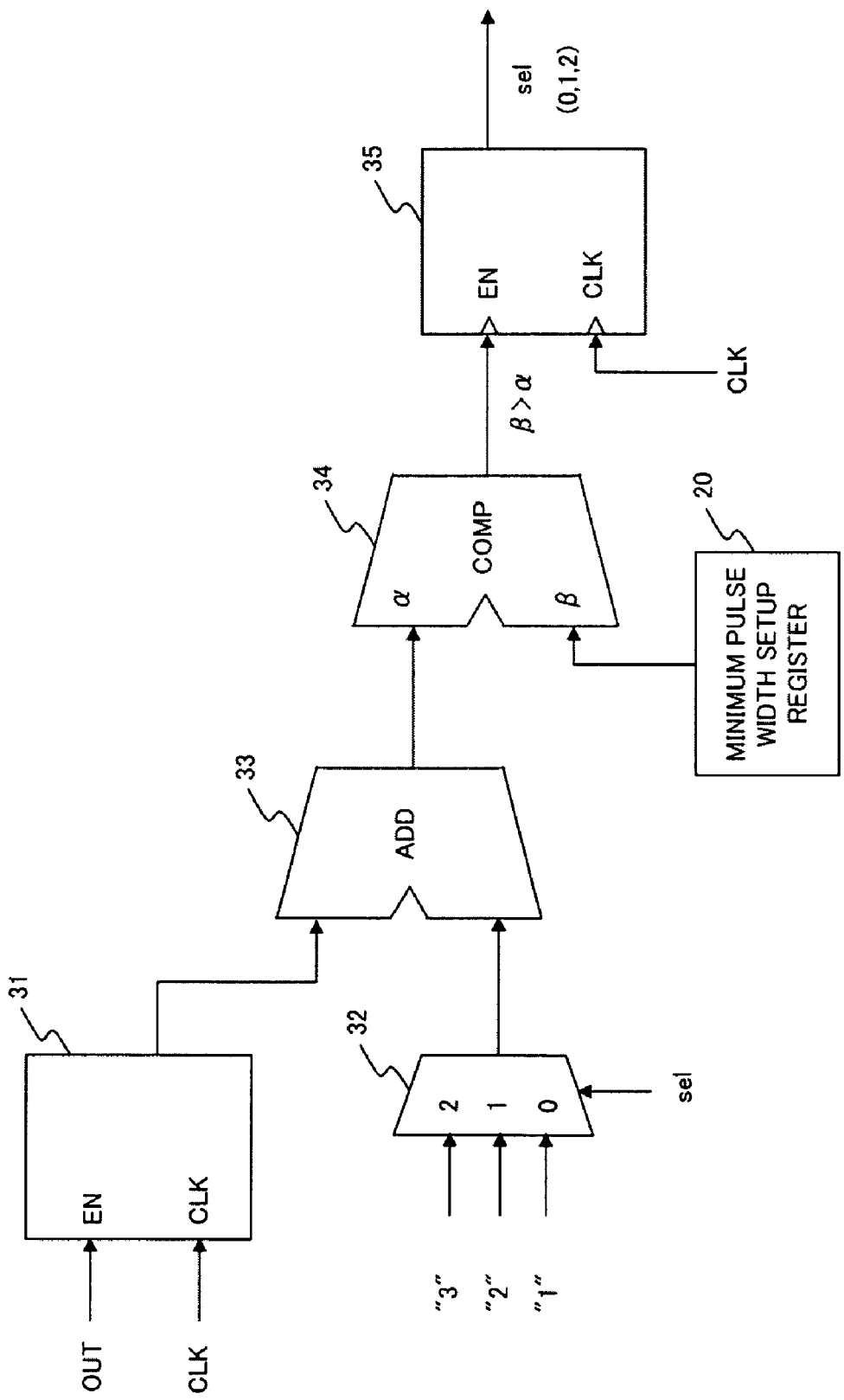
FIG. 3 shows a comprisal of a wave form check unit.

The following is a detailed description of the preferred embodiment of the present invention while referring to the accompanying drawings.

FIG. 2 exemplifies a comprisal of a noise filter circuit according to the present embodiment.

As shown by FIG. 2, a noise filter circuit according to the present embodiment comprises four-stages of serially connected D flip flops (simply "FF" hereinafter) 11 through 14 which receive a signal, as an input signal, output from an A/D converter that receives an input signal such as a trigger signal for an edge detection to operate synchronously with an internal clock signal CLK.

And a signal X is generated by obtaining the AND of an output A of the first stage FF 11 and an output B of the second stage FF 12 by an AND circuit 15; a signal Y is generated by obtaining the AND of the signal X and an output of the third stage FF 13 by the AND circuit 16, and further a signal Z is generated by the AND of the signal Y and an output of the fourth stage FF 14. Then these signals X, Y and Z are input to a selection circuit 18.

The selection circuit 18 selects one of the three signals, i.e., the input signal X down to the second stage, signal Y down to the third stage and signal Z down to the fourth stage, and outputs it as an output signal OUT based on a selection signal, sel, from a later described wave form check unit 19. This output signal OUT becomes a filter output.

The wave form check unit 19 monitors whether or not a signal with a pulse width which is the minimum pulse width, or less, set up in a minimum pulse width setup register 20 is output from the filter output signal OUT and, if a value of the minimum pulse width, or less, is output, then changes a value of the selection signal sel and changes the output OUT of the selection circuit 18 from a signal X to signal Y, or from a signal Y to signal Z.

By this configuration, a suitable number of stages of filter is capable of removing a pulse with a set width or less.

The minimum pulse width setup register 20 is for the user designating the minimum pulse width of an input signal, enabling a designation of the minimum pulse width after passing through a filter by setting up the minimum pulse width setup register 20 with a value. If a pulse with less than a minimum value set up for the minimum pulse width setup register 20 is output as an output signal OUT, the wave form check unit 19 controls the selection circuit 18 to have the number of stages of filter increased hardware wise.

The filter value optimization complete flag (STATUS BIT) 21 is a flag set in the case of confirming that an output signal OUT not including a pulse width less than the minimum pulse width which has been set in the minimum pulse width setup register 20 within a certain period of time (e.g., one millisecond), the status bit is cleared when a signal with an input width less than the minimum pulse width is input during the execution of a filter value optimization processing. By the filter value optimization complete flag 21 being set, the processor, et cetera, are enabled to recognize the completion of a filter value optimization processing.

FIG. 3 shows a comprisal of the wave form check unit 19.

The wave form check unit 19 comprises an output pulse width counter 31 operating synchronously with the internal clock CLK by receiving a filter output signal OUT as the input, a selection circuit 32 for outputting "3", "2" or "1" as an output based on a value of a selection signal sel, an adder circuit 33 for adding a count value output from the output pulse width counter 31 to an output value of the selection circuit 32, a comparator circuit 34 for comparing the addition result output by the adder circuit 33 with a value which is set in the minimum pulse width setup register 20 and, if the addition result output by the adder circuit 33 is equal to, or greater than, the value which is set in the minimum pulse width setup register 20, then outputs, and a filter output addition counter 35 for outputting a selection signal sel, as "1", "2" or "3" based on the value of the comparator circuit 34 synchronously with the internal clock CLK.

The selection signal sel indicates "0" as the initial state, and accordingly the selection circuit 18 shown by FIG. 2 outputs a signal X as the filter output signal OUT. The wave form check unit 19 monitors the filter output signal OUT and controls the selection circuit 18 by the selection signal sel so that a pulse with a width having a value equal to or less than that set in the minimum pulse width setup register 20 will not be output. And, if the filter output signal OUT is outputting a pulse with a width having a value equal to or less than that set in the minimum pulse width setup register 20, the wave form check unit 19 switches over the number of stages of filters dynamically by changing the selection signal sel from "0" to "1", or from "1" to "2", makes the filter output signal OUT change from a signal X to signal Y, or from a signal Y to signal Z, and steps up the number of stages of filters in order that a pulse with a width having a value equal to or less than that set in the minimum pulse width setup register 20 will not be output.

The above described operation is accomplished in the circuit shown by FIG. 3 as follows:

First, as a filter output signal OUT is input to the output pulse width counter 31, it counts synchronously with the internal clock CLK for a period of time when the filter output signal OUT is high. And the counted value is added to an output value of the selection circuit 32 (i.e., "1" in this case because the initial value of the selection signal sel is "0") by using the adder circuit 33, followed by the comparator circuit 34 comparing the aforementioned added value with a value set in the minimum pulse width setup register 20. As a result of the comparison, if the output of the adder circuit 33 is less than the set value in the minimum pulse width setup register 20, the comparator circuit 34 outputs a high, thereby incrementing the count value from "0" to "1" in the filter output addition counter 35. Note that the present embodiment is configured for a value 0, 1 or 2 for the selection signal sel as an output of the filter output addition counter 35.

By the above described processing, the filter output is changed to Y, and the output of the selection circuit 32 is changed from "1" to "2", and likewise it is checked whether or not the filter output signal OUT is overlapped by a pulse with a width equal to or less than that which is set in the minimum pulse width setup register 20 and, if overlapped, the selection signal sel is changed from "1" to "2" to increment the number of stages of filter accordingly.

As described above, the present embodiment is configured so that the wave form check unit 19 checks a pulse width on the filter output signal OUT and increments the number of stages of filter dynamically until a noise is removed if a pulse no more than a setup value, that is, a noise, is overlapped.

FIG. 4 shows a comprisal of the filter value optimization complete flag 21.

The filter value optimization complete flag 21 comprises an operation time monitor counter 41 for counting down a count value N synchronously with the internal clock CLK and outputting when the count value becomes "0" and an input signal is detected, and an FF 42 for latching an output value of the operation time monitor counter 41 synchronously with the internal clock CLK.

The filter value optimization complete flag 21, being a flag for indicating whether or not an optimization processing of a filter is complete, indicates that an optimization of a filter width is complete if the filter value optimization complete flag 21 is "on", and indicates that an optimization is in progress or failed if the filter value optimization complete flag 21 is "off" in which case the optimization processing is carried out again, followed by proceeding with processing.

Figure 5:
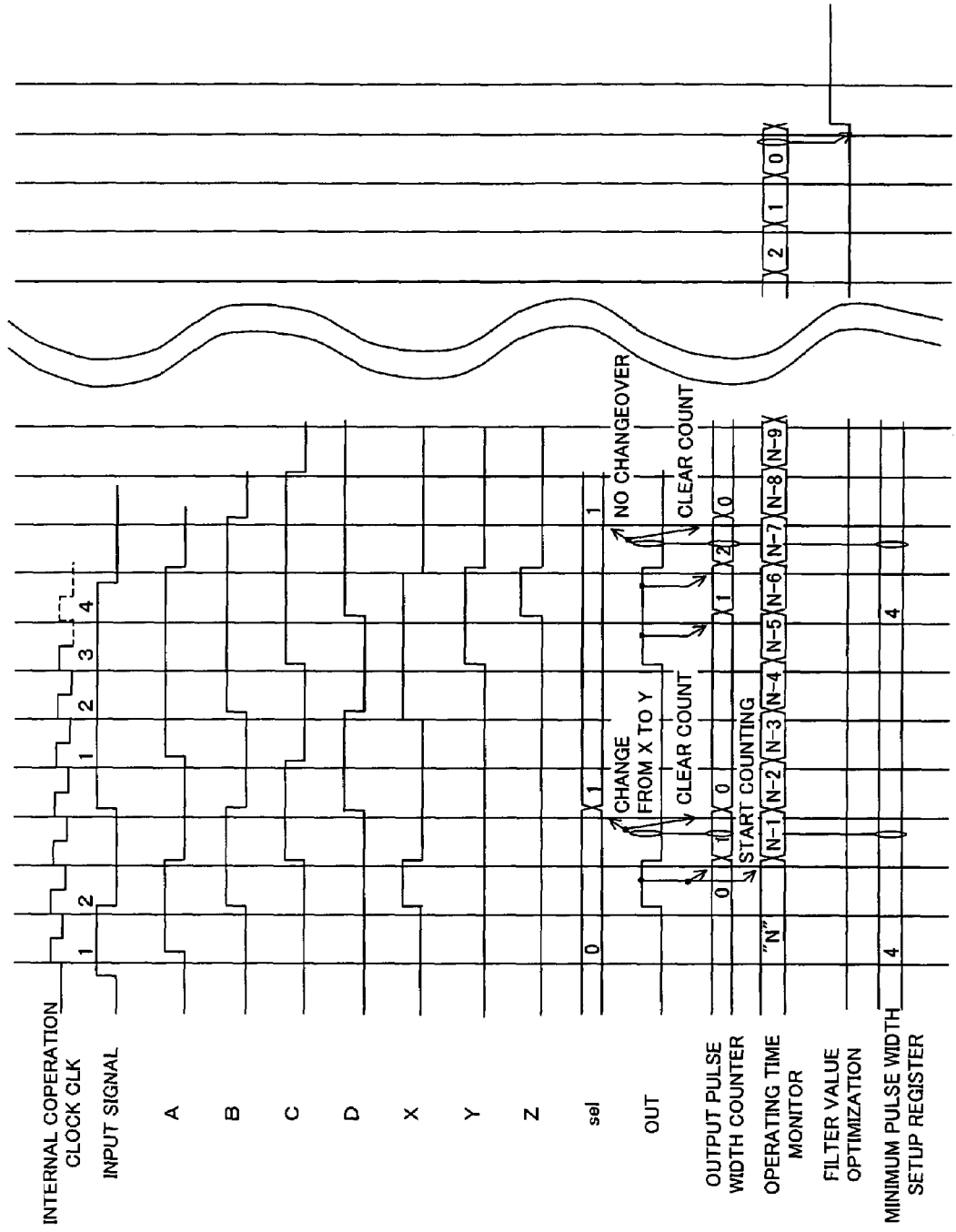
FIG. 5 shows a timing chart indicating the timing of each signal of a noise filter circuit according to the present embodiment.

FIG. 5 shows a timing chart indicating a timing of each signal on a noise filter circuit according to the present embodiment.

FIG. 5 exemplifies as a concrete example in which a "4" is set (specifying a signal with a width larger than three cycles of the internal clock CLK as the input signal) in the minimum pulse width setup register 20, hence removing noise, which is overlapped with an input signal with a width of two cycles (i.e., one cycle, or greater, and less than two cycles) of the internal clock CLK.

As shown by FIG. 5, if receiving an input signal overlapped with a noise with a two-cycle width, the input signal is input to the FF 11 which then outputs a signal A shown by FIG. 5. Likewise, the FF 12 on the second stage, FF 13 on the third stage and FF 14 on the fourth stage respectively output the signals B, C and D by delaying by the amount of one cycle of the internal clock CLK, respectively. And generates the signals X, Y and Z as the filter output signals OUT from the output signals A through D of the FFs 11 through 14, respectively. As shown in FIG. 5, the signal X is a signal taking the AND of the signals A and B, the signal Y is a signal taking that of the signals A, B and C, and the signal Z is a signal taking that of the signal A, B, C and D.

In the initial state, the selection signal sel is "0", so that the signal with the lowest number of stages is selected as the filter output signal OUT.

In this state, since the filter output signal OUT (i.e., the signal X in this event) is overlapped by a pulse with a smaller pulse width than the setup value of the minimum pulse width setup register 20 (i.e., "4" in this event, that is, a value larger than 3CLK for the pulse width of the input signal), the filter output addition counter 35 of the wave form check unit 19 changes the selection signal sel from "0" to "1" by incrementing the counter value. By so doing, the filter output signal OUT is changed from the signal X to signal Y.

In this state, as the output pulse width counter 31 counts based on the pulse width of the filter output signal OUT, the count value becomes "2", the added value of the adder circuit is (the count: 2)+(the filter value as the output of the selection circuit: 2)=4, and the filter output addition counter 35 remains un-incremented because the setup value of the minimum pulse width setup register 20 is equal to, or greater than "4", resulting in the selection signal sel remaining at "1". Accordingly, the signal Y with a number of stages of three is output as the filter output signal OUT. Then, when the operation time monitor counter counts the internal operation clock CLK up to "N", sets the filter value optimization complete flag (STATUS BIT) 21.

As such, the noise filter according to the present embodiment is capable of changing over to a filter of a corresponding noise width by switching the number of stages of a filter dynamically based on the width of noise of an input signal.

This changes over to a filter of the least number of stages, thereby making it possible to suppress a penalty of a noise removal time which is caused by increasing the number of stages of filters.

And changing over the number of stages of filter is carried out dynamically by hardware, and accomplished unassisted by software, hence improving the execution time.

Note that the above described example is configured with the number of stages of filter being four, the noise filter according to the present embodiment, however, may be configured with three stages, five stages or more, instead of being limited as shown by the example.

What is claimed is:

1. An $\{N-1\}$-stage noise filter, used for a digital signal, comprising:
an N number of flip flops connected in series;
at least an $\{N-1\}$ number of AND circuits configured such that outputs from a first and a second of the flip flops are input to a first of the AND circuits, and for each n of $2 \leq n \leq N-1$, an output from an $\{n+1\}$-th of the flip flops and an output from an $\{n-1\}$-th of the AND circuits are input to an n-th of the AND circuits in order for each n-th AND circuit for $1 \leq n \leq N-1$ to be configured to output, as an output of an n-th stage filter in the noise filter, an AND of outputs of the first to $\{n+1\}$-th flip flops;
a selection unit to output a filter output signal by selecting one of the outputs from the first to $\{N-1\}$-th AND circuits based on a selection signal;
a wave form check unit to make the selection unit change a selection thereby by changing a value of the selection signal based on a pulse width on the filter output signal which is output from the selection unit; and
a minimum pulse width designation register to set a minimum width of a pulse of said filter output signal, wherein said wave form check unit comprises,
an output pulse width counter to count synchronously with an internal clock for a period of time when the filter output signal is high and to output a counted value;
a comparison unit to compare an added value that is the counted value added by a filter value, which is determined by said selection signal, with a set value of said minimum pulse width designation register; and
a filter output changeover counter to change the selection signal once the added value is less than the set value of the minimum pulse width designation register as a result of the comparison by the aforementioned comparison unit.

2. The noise filter according to claim 1, further comprising;
a filter value optimization complete flag to measure a certain time and being set once optimizing said $\{N-1\}$ number of stages of filters is complete after the certain time elapses.

3. The noise filter according to claim 1, wherein
said wave form check unit to change the value of said selection signal so that said selection unit changes the value of the selection signal to a signal filtered by a filter with a higher number of stages.

4. An $\{N-1\}$-stage noise filter, used for a digital signal, comprising:
an N number of flip flops connected in series;
at least an $\{N-1\}$ number of AND means configured such that outputs from a first and a second of the flip flops are input to a first of the AND means, and for each n of $2 \leq n \leq N-1$ an output from an $\{n+1\}$-th of the flip flops and an output from an $\{n-1\}$-th of the AND means are input to an n-th of the AND means in order for each n-th AND means for $1 \leq n \leq N-1$ to be configured to output, as an output of an n-th stage filter means in the noise filter, an AND of outputs of the first to {n+1}-th flip flops;

selection means for outputting a filter output signal by selecting one of the outputs from the first to {N−1}-th AND means based on a selection signal;

wave form check means for making the selection means change a selection thereby by changing a value of the selection signal based on a pulse width on the filter output signal which is output from the selection means; and a minimum pulse width designation register for setting a minimum width of a pulse of said filter output signal, wherein said wave form check means comprises, an output pulse width counter for counting synchronously with an internal clock for a period of time when the filter output signal is high and outputting a counted value;

a comparison means for comparing an added value that the counted value, added by a filter value, which is determined by said selection signal, with a set value of said minimum pulse width designation register; and a filter output changeover counter for changing the selection signal once the added value is less than the set value of the minimum pulse width designation register as a result of the comparison by the aforementioned comparison means.

5. A noise filtering method by an {N−1}-stage noise filter, used for a digital signal, comprising:

inputting, to a first of at least an {N−1} number of AND circuits, outputs from a first and a second of an N number of flip flops connected in series;

for each n of $2 \leq n \leq N-1$, inputting an output from an {n+1}-th of the flip flops and an output from an {n−1}-th of the AND circuits to an n-th of the AND circuits;

outputting a filter output signal by selecting, based on a selection signal, one of the outputs from the first to {N−1}-th AND circuits where each output from each n-th AND circuit for $1 \leq n \leq N-1$ represents an AND of outputs of the first to {n+1}-th flip flops; and changing a value of the selection signal based on a pulse width on the filter output signal, wherein the changing includes, counting synchronously with an internal clock for a period of time when the filter output signal is high and outputting a counted value;

comparing an added value that the counted value, added by a filter value, which is determined by said selection signal, with a set value of a minimum width of the pulse of said filter output signal; and changing the selection signal once the added value is less than the set value as a result of the comparison.

* * * * *